(12) United States Patent
Duan et al.

(10) Patent No.: US 8,243,432 B2
(45) Date of Patent: Aug. 14, 2012

(54) SUPPORT MECHANISM FOR PORTABLE ELECTRONIC DEVICE

(75) Inventors: Chao Duan, Shenzhen (CN); Chia-Hua Chen, Taipei (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 20 days.

(21) Appl. No.: 12/859,152

(22) Filed: Aug. 18, 2010

(65) Prior Publication Data

US 2011/0164358 A1  Jul. 7, 2011

(30) Foreign Application Priority Data

Jan. 7, 2010  (CN) .......................... 2010 1 0300109

(51) Int. Cl.
*H05K 5/00* (2006.01)
*H05K 7/00* (2006.01)

(52) U.S. Cl. ........... 361/679.3; 361/679.56; 361/679.59; 248/677; 248/686; 248/688; 248/188.8

(58) Field of Classification Search ............... 361/679.3, 361/679.56, 679.59; 248/677, 686, 688, 248/188.8
See application file for complete search history.

(56) References Cited

U.S. PATENT DOCUMENTS

| | | | |
|---|---|---|---|
| 6,880,796 B2 * | 4/2005 | Khor et al. ................... 248/677 |
| 6,952,341 B2 * | 10/2005 | Hidaka et al. ............. 361/679.32 |
| 7,681,859 B2 * | 3/2010 | Kim ............................. 248/688 |
| 7,746,636 B2 * | 6/2010 | Tang ........................ 361/679.55 |
| 8,035,961 B2 * | 10/2011 | Figuerado et al. ........ 361/679.37 |
| 2006/0237623 A1 * | 10/2006 | Sung ............................. 248/688 |
| 2007/0012856 A1 * | 1/2007 | Chan et al. .................... 248/677 |

* cited by examiner

*Primary Examiner* — Anthony Haughton
(74) *Attorney, Agent, or Firm* — Altis Law Group, Inc.

(57) ABSTRACT

An exemplary support mechanism for a portable electronic device includes a seat, a button, a support member, and a hinge assembly. The seat defines a cavity. The button is received in the cavity. The support member includes a knuckle portion. The knuckle portion is received in the cavity. The button abuts against the support member. The hinge assembly connects the knuckle portion to the seat. When the button is pressed to force the hinge assembly to unlock, the hinge assembly drives the support member to rotate.

20 Claims, 5 Drawing Sheets

SUPPORT MECHANISM FOR PORTABLE ELECTRONIC DEVICE

BACKGROUND

1. Technical Field

The present disclosure relates to support mechanisms, particularly to a support mechanism used in a portable electronic device.

2. Description of Related Art

Portable electronic devices such as mobile phones include several types of support systems such as bar type, flip-type and slide-type so as to satisfy different tastes of different people. Current support systems, typically only allow the electronic device to be held in a predetermined position. Therefore, when the portable electronic device is placed on a desk, it can be difficult for users to view a display screen disposed on the housing.

Therefore, there is room for improvement within the art.

BRIEF DESCRIPTION OF THE DRAWINGS

Many aspects of the disclosed support mechanism can be better understood with reference to the following drawings. The components in the drawings are not necessarily drawn to scale, the emphasis instead being placed upon clearly illustrating the principles of the present support mechanism.

DETAILED DESCRIPTION

The disclosed support mechanism in accordance with various exemplary embodiments herein may be applied in portable electronic devices such as mobile phones, personal digital assistants (PDAs), and so on. In the exemplary embodiment, the support mechanism as used in a mobile phone is illustrated. However, the disclosure is not limited to use in a mobile phone.

Figure 1:
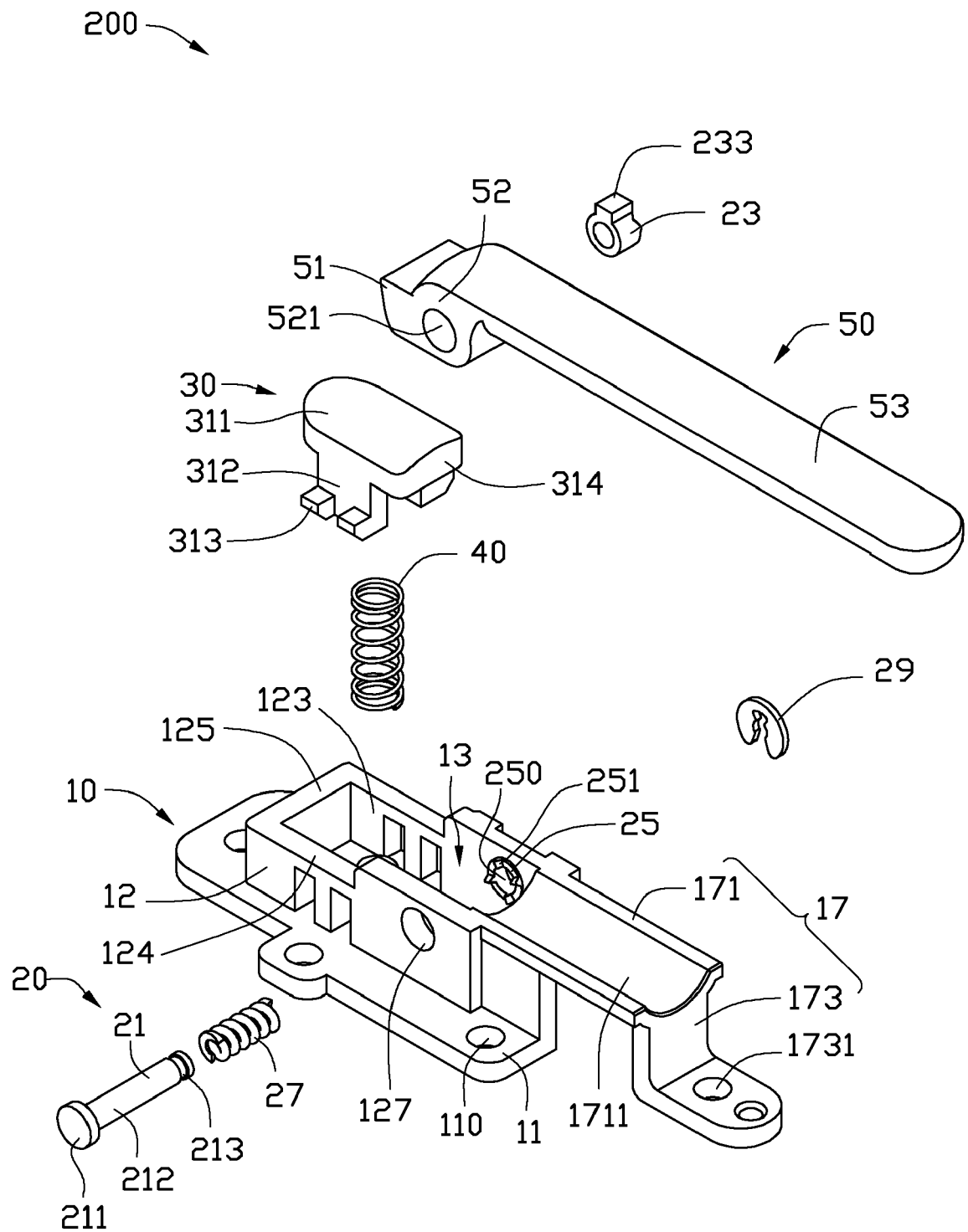
FIG. 1 is an exploded view of a support mechanism in accordance with an exemplary embodiment.
Figure 2:
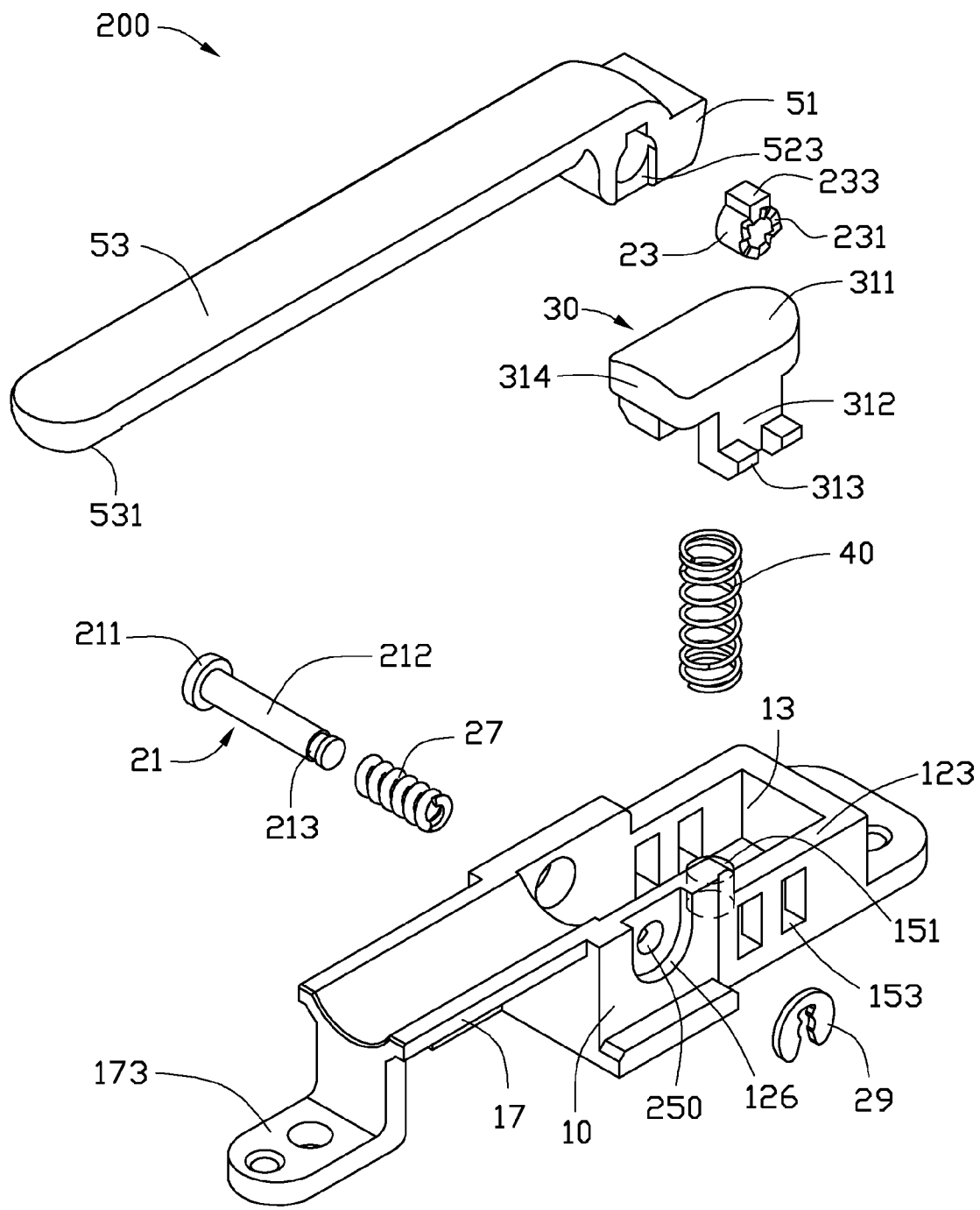
FIG. 2 is similar to FIG. 1, but shown from another aspect.

FIGS. 1 and 2 show a support mechanism 200 including a seat 10, a hinge assembly 20, a button 30, an elastic member 40, and a support member 50.

The seat 10 includes a base plate 11 defining a plurality of fastener holes 110. A frame 12 is positioned on the base plate 11. The frame 12 includes a first sidewall 123, a second sidewall 124 and two opposite end walls 125. The first, second sidewalls 123, 124 and the end walls 125 cooperatively surround a cavity 13. A follower 25 is integrally formed with the first sidewall 123. The follower 25 includes a central hole 250 and a cam surface 251. The cam surface 251 faces an inside of the first sidewall 123. A U-shaped receiving groove 126 is defined in an outside of the first sidewall 123, and communicates with the central hole 250. A through hole 127 is defined in the second sidewall 124. A plurality of openings 153 are defined in the first, second sidewalls 123, 124. A guide shaft 151 protrudes from the base plate 11 in the cavity 13, and is disposed between the openings 153. An arm 17 extends from a top end of one end wall 125. The arm 17 includes a holding plate 171 and a fixing plate 173. The holding plate 171 is parallel to the base plate 11. An arcuate recess 1711 is defined in the holding plate 171. The fixing plate 173 perpendicularly extends from a distal end of the holding plate 171, and is further bent to be parallel to the base plate 11. The fixing plate 173 defines a plurality of fastener holes 1731. The fastener holes 110, 1731 are configured for mounting the seat 10 to the portable electronic device with a fastener, such as bolts.

The hinge assembly 20 includes a shaft 21, a cam 23, the follower 25, a resilient member 27 and a washer 29. The shaft 21 includes a head portion 211 and a shaft portion 212. The shaft portion 212 extends from one side of the head portion 211. One distal end of the shaft portion 212 defines a ring groove 213. The cam 23 can be placed around the shaft portion 212, and includes a latching cam surface 231. A block 233 is positioned on a peripheral wall of the cam 23. The cam surface 251 of the follower 25 engages with the latching cam surface 231. The resilient member 27 is a helical spring, and may be placed around the shaft portion 212. The washer 29 is configured for latching in the receiving groove 126 and the ring groove 213.

The button 30 can be received in the frame 10, and includes an operating portion 311 and two legs 312 extending from two sides of the operating portion 311. The operating portion 311 can resist the guide shaft 151. The operating portion 311 includes a pressing end 314. A plurality of feet 313 extend from each leg 312. Each foot 313 may be latched in a corresponding opening 153. The elastic member 40 may be a helical spring, and may be placed around the guide shaft 151.

The support member 50 includes a protrusion 51, a knuckle portion 52 and a lever 53. The knuckle portion 52 is positioned between the protrusion 51 and the lever 53. The knuckle portion 52 defines a circular hole 521 at one side thereof, and a latching groove 523 is defined at another side thereof. The cam 23 can be non-rotatably received in the latching groove 523 due to the block 233. The lever 53 includes a distal end 531 made of rubber. The distal end 531 may not only prevent wear and tear of the lever 53, but also can increase traction when the support member 50 is in an opened position and in use.

Figure 3:
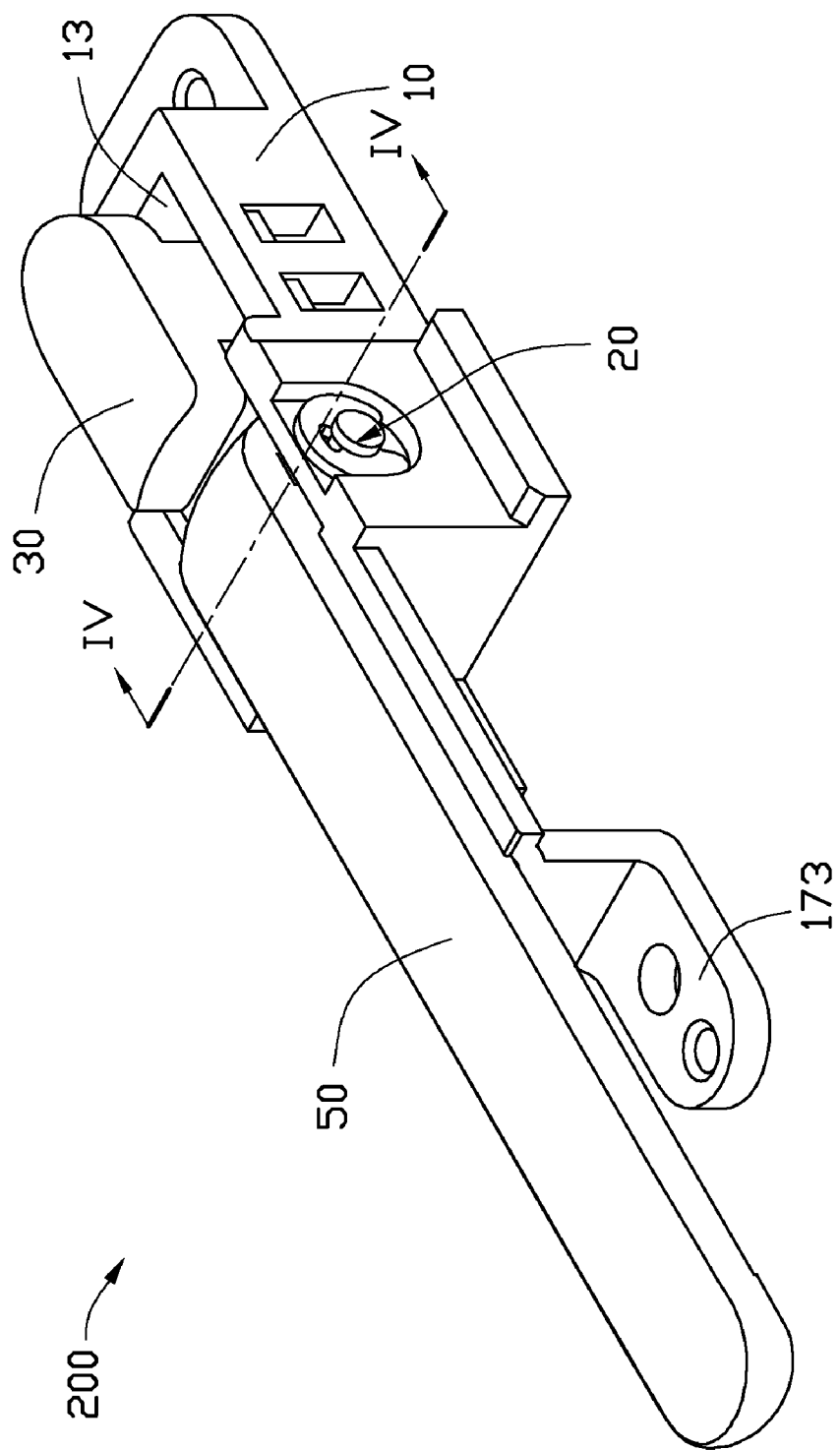
FIG. 3 is an assembled, isometric view of the support mechanism of FIG. 1.
Figure 4:
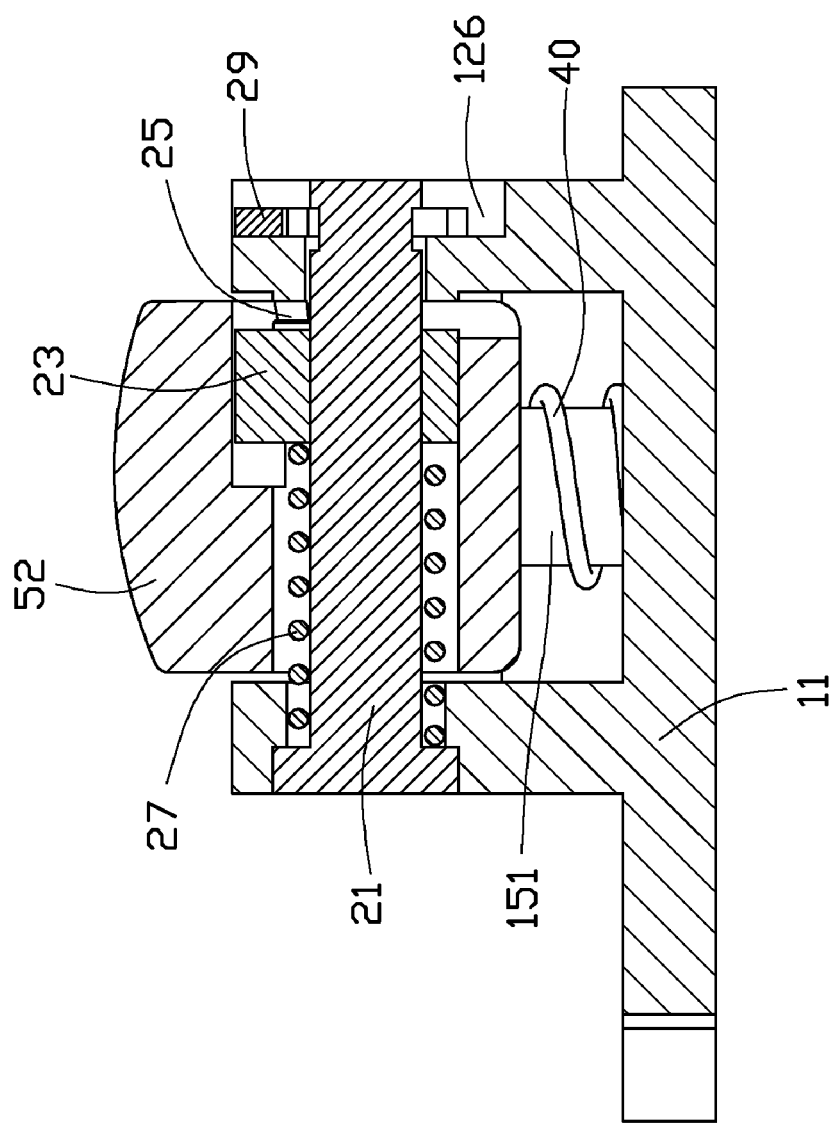
FIG. 4 is a cross-sectional view of FIG. 3 taken along line IV-IV.

Referring to FIGS. 3 and 4, during assembly, the cam 23 is received in the latching groove 523 of the knuckle portion 52. The latching cam surface 231 faces an outside of the knuckle portion 52. The knuckle portion 52 with the cam 23 and the protrusion 51 are received in the cavity 13 of the frame 12. The cam surface 251 of the follower 25 engages with the latching cam surface 231 of the cam 23. The lever 53 is received in the recess 1711 of the holding plate 171. The circular hole 521 is aligned with the through hole 127 and the central hole 250. The resilient member 27 is positioned in the cavity 13. One end of the shaft 21 distal from the head portion 211 is inserted into the through hole 127, the resilient member 27, the knuckle portion 52, the cam 23, and the follower 25, and is exposed from the receiving groove 126. The washer 29 is latched in the ring groove 213 of the shaft 21. After that, the elastic member 40 is placed around the guide shaft 151. The feet 312 of the button 30 are slidably latched in the openings 153 of the seat 10. The pressing end 314 presses the protrusion 51 of the support member 50. Thus, the assembly of the support mechanism 200 is finished. When the support member 50 is in a fully closed position, the lever 53 is totally received in the recess 1711 of the holding plate 171. Since the pressing end 314 presses the protrusion 51 of the support member 50, the hinge assembly 20 is in a steady state.

Figure 5:
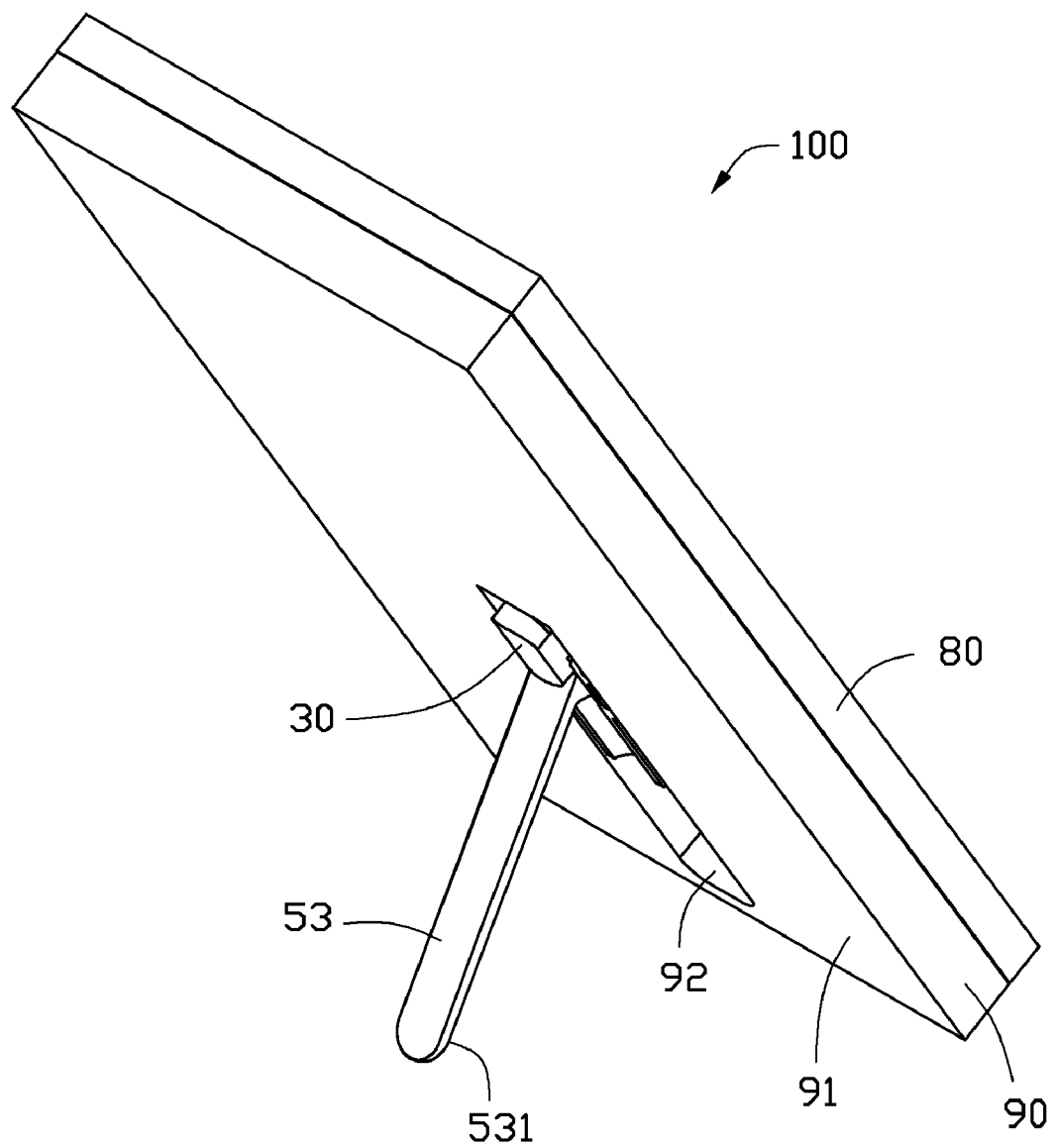
FIG. 5 is a state view of the support mechanism used in a portable electronic device.

Referring to FIG. 5, the support mechanism 200 is applied in a mobile phone 100 including a cover section 80 and a body section 90. The body section 90 includes a back surface 91 and a depression 92. The base plate 11 and the fixing plate 173 are fixed in the depression 92. The button 30 and the support member 50 are exposed from the depression 92.

When the user browses a display screen of the electronic device 100, the electronic device 100 may be placed on a desk with the support mechanism 200. The operating portion 311 of the button 30 is pressed, and compresses the elastic member 40. At the same time, the operating portion 311 presses the protrusion 51 of the support member 50 forcing the knuckle portion 52 to rotate. The knuckle portion 52 causes the cam 23 to rotate to an unsteady state relative to the follower 25. Since the follower 25 cannot move, when the button 30 is released, the cam 23 rotates and slides relative to the follower 25. The button 30 returns to an original state due to the elastic member 40. The support member 50 is thus opened automatically to a predetermined position under the decompression force of the resilient member 27. In this exemplary embodiment, the lever 53 may be automatically opened to 20 degrees. After this angle, the lever 53 may be manually opened to a suitable degree according to the user's requirement. Alternatively, the lever 53 may be automatically opened to a suitable degree depending on the cam structure design.

It is to be understood, however, that even through numerous characteristics and advantages of the present embodiments have been set forth in the foregoing description, together with details of assembly and function, the disclosure is illustrative only, and changes may be made in detail, especially in matters of shape, size, and arrangement of parts within the principles of the disclosure to the full extent indicated by the broad general meaning of the terms in which the appended claims are expressed and equivalents thereof.

What is claimed is:

1. A support mechanism for a portable electronic device, comprising:
    a seat defining a cavity;
    a button received in the cavity;
    a support member including a knuckle portion, the knuckle portion received in the cavity, the button abutting against the support member; and
    a hinge assembly connecting the knuckle portion to the seat, the hinge assembly including a shaft, a cam, and a follower, the cam and the follower placed around the shaft, the cam non-rotatably connected to the support member, the follower non-rotatably connected to the seat, the follower including a cam surface, the cam including a latching cam surface engaging with the cam surface to rotate relative to each other along the shaft;
    wherein when the button is pressed to unlock the hinge assembly, the cam automatically rotates relative to the follower, the cam rotates the support member to a predetermined position, the support member supports the weight of the portable electronic device and keeps the portable electronic device on a support surface.

2. The support mechanism of claim 1, wherein the follower is fixed to the seat.

3. The support mechanism of claim 1, wherein the seat includes a base plate and a frame, the frame is positioned on the base plate, the frame includes a first sidewall, a second sidewall and two opposite end walls, and the first, second sidewalls and the end walls cooperatively surround the cavity, the base plate defines a plurality of fastener holes configured for mounting the seat to a portable electronic device.

4. The support mechanism of claim 3, wherein the follower is integrally formed with the first sidewall.

5. The support mechanism of claim 4, wherein the follower defines a central hole, the second sidewall defines a through hole, and the central hole and the through hole are aligned with each other.

6. The support mechanism of claim 3, wherein an arm extends from one end wall, the arm includes a holding plate and a fixing plate, the holding plate is parallel to the base plate, the fixing plate perpendicularly extends from a distal end of the holding plate, and is further bent to be parallel to the base plate.

7. The support mechanism of claim 3, wherein the first, second sidewalls define a plurality of openings, a guide shaft protrudes from the base plate in the cavity, and is disposed between the openings.

8. The support mechanism of claim 7, wherein the button includes an operating portion and two legs extending from two sides of the operating portion, the operating portion resists the guide shaft, each leg includes a plurality of feet, and each foot is slidably latched in a corresponding opening.

9. The support mechanism of claim 1, wherein the hinge assembly includes a resilient member, the cam, the follower and the resilient member are received in the cavity, the shaft extends through one side of the seat, the resilient member, the knuckle portion, the cam, and the follower, and is fixed to the other side of the seat.

10. The support mechanism of claim 8, wherein the support member includes a protrusion and a lever, and the knuckle portion is positioned between the protrusion and the lever, the button includes a pressing end which presses the protrusion.

11. The support mechanism of claim 9, wherein the knuckle portion defines a circular hole at one side thereof, and a latching groove is defined at another side thereof, a block is positioned on a peripheral wall of the cam, the block is latched in the latching groove allow the cam to be non-rotatably received in the latching groove.

12. The support mechanism of claim 3, wherein a U-shaped receiving groove is defined in an outside of the first sidewall, the hinge assembly includes a washer, the washer is latched on the shaft, and is received in the receiving groove.

13. An electronic device comprising a support mechanism, the support mechanism comprising;
    a seat configured for being fixed to the electronic device, the seat defining a cavity;
    a button received in the cavity;
    a support member including a knuckle portion, the knuckle portion received in the cavity, the button abutting against the support member; and
    a hinge assembly connecting the knuckle portion to the seat, the hinge assembly including a shaft, a cam, and a follower, the cam and the follower placed around the shaft, the cam non-rotatable connected to the support member, the follower non-rotatable connected to the seat, the follower including a cam surface, the cam including a latching cam surface engaging with the cam surface to rotate relative to each other along the shaft;
    wherein when the button is pressed to rotate the knuckle to unlock the hinge assembly, the cam automatically drives the support member to rotate relative to the follower to support the electronic device in an inclined position, the support member supports the weight of the portable electronic device and keeps the portable electronic device on a support surface.

14. The electronic device of claim 13, wherein the hinge assembly includes a resilient member, the cam, the follower and the resilient member are received in the cavity, the shaft extends through one side of the seat, the resilient member, the knuckle portion, the cam, and the follower, and is fixed to the other side of the seat.

15. The electronic device of claim 14, wherein the knuckle portion defines a circular hole at one side thereof, and a latching groove is defined at another side thereof, a block is positioned on a peripheral wall of the cam, the block is latched in the latching groove for allowing the cam to be non-rotatably received in the latching groove.

16. The electronic device of claim 15, wherein the seat includes a base plate and a frame, the frame is positioned on the base plate, the frame includes a first sidewall, a second sidewall and two opposite end walls, and the first, second sidewalls and the end walls cooperatively surround the cavity, and the follower is integrally formed with the first sidewall.

17. The electronic device of claim 16, wherein the follower defines a central hole, the second sidewall defines a through hole, and the central hole and the through hole are aligned with each other.

18. The electronic device of claim 16, wherein an arm extends from one end wall, the arm includes a holding plate and a fixing plate, the holding plate is parallel to the base plate, the fixing plate perpendicularly extends from a distal end of the holding plate, and is further bent to be parallel to the base plate.

19. The electronic device of claim 16, wherein the first, second sidewalls define a plurality of openings, a guide shaft protrudes from the base plate in the cavity, and is disposed between the openings.

20. The electronic device of claim 19, wherein the button includes an operating portion and two legs extending from two sides of the operating portion, the operating portion resists the guide shaft, each leg includes a plurality of feet, and each foot is slidably latched in a corresponding opening.

* * * * *